(12) United States Patent
Wang et al.

(10) Patent No.: US 12,564,026 B2
(45) Date of Patent: Feb. 24, 2026

(54) METHOD OF REMOVING BARRIER LAYER

(71) Applicant: ACM RESEARCH (SHANGHAI), INC., Shanghai (CN)

(72) Inventors: Hui Wang, Shanghai (CN); Hongwei Zhang, Shanghai (CN); Yingwei Dai, Shanghai (CN); Yinuo Jin, Shanghai (CN); Jian Wang, Shanghai (CN)

(73) Assignee: ACM Research (Shanghai) Inc., Shanghai (CN)

( * ) Notice: Subject to any disclaimer, the term of this patent is extended or adjusted under 35 U.S.C. 154(b) by 380 days.

(21) Appl. No.: 18/001,204

(22) PCT Filed: May 31, 2021

(86) PCT No.: PCT/CN2021/097253
§ 371 (c)(1),
(2) Date: Dec. 8, 2022

(87) PCT Pub. No.: WO2021/249224
PCT Pub. Date: Dec. 16, 2021

(65) Prior Publication Data
US 2023/0223301 A1 Jul. 13, 2023

(30) Foreign Application Priority Data
Jun. 9, 2020 (CN) .......................... 202010519561.8

(51) Int. Cl.
*H01L 21/768* (2006.01)
*H01L 21/02* (2006.01)
(Continued)

(52) U.S. Cl.
CPC .. *H01L 21/76883* (2013.01); *H01L 21/02175* (2013.01); *H01L 21/02244* (2013.01);
(Continued)

(58) Field of Classification Search
None
See application file for complete search history.

(56) References Cited

U.S. PATENT DOCUMENTS

| | | | |
|---|---|---|---|
| 2007/0069383 A1 | 3/2007 | Suzuki | |
| 2007/0111524 A1 | 5/2007 | Lee | |

(Continued)

FOREIGN PATENT DOCUMENTS

| | | |
|---|---|---|
| CN | 101558476 A | 10/2009 |
| CN | 103000575 A | 3/2013 |
| CN | 109300783 A | 2/2019 |

OTHER PUBLICATIONS

International Search Report issued in International Application No. PCT/CN2021/097253 dated Aug. 16, 2021 (2 pages).
(Continued)

*Primary Examiner* — Allan W. Olsen
(74) *Attorney, Agent, or Firm* — Osha Bergman Watanabe & Burton LLP

(57) ABSTRACT

Embodiments of the present invention provide a method for removing a barrier layer of a metal interconnection on a wafer, which remove a single-layer metal ruthenium barrier layer. A method comprises: oxidizing step, is to oxidize the single-layer metal ruthenium barrier layer into a ruthenium oxide layer by electrochemical anodic oxidation process; oxide layer etching step, is to etch the ruthenium oxide layer with etching liquid to remove the ruthenium oxide layer. The present invention also provides a method for removing a barrier layer of a metal interconnection on a wafer, using in a structure of a process node of 10 nm and below, wherein the structure comprises a substrate, a dielectric layer, a barrier layer and a metal layer, the dielectric layer is deposited on the substrate and recessed areas are formed on the dielectric layer, the barrier layer is deposited on the dielectric layer, the metal layer is deposited on the barrier layer, (Continued)

wherein the metal layer is a copper layer, the barrier layer is a single-layer metal ruthenium layer, and the method comprises: thinning step, is to thin the metal layer; removing step, is to remove the metal layer; oxidizing step, is to oxidize the barrier layer, and the oxidizing step uses an electrochemical anodic oxidation process; oxide layer etching step, is to etch the oxidized barrier layer.

9 Claims, 7 Drawing Sheets

(51) Int. Cl.
   *H01L 21/311*            (2006.01)
   *H01L 21/321*            (2006.01)
(52) U.S. Cl.
   CPC ..  *H01L 21/02258* (2013.01); *H01L 21/31111* (2013.01); *H01L 21/3212* (2013.01); *H01L 21/76843* (2013.01)

(56)                     References Cited

U.S. PATENT DOCUMENTS

| | | | |
|---|---|---|---|
| 2011/0177692 A1* | 7/2011 | Wang | H01L 21/67069 |
| | | | 438/704 |
| 2017/0194192 A1 | 7/2017 | Yu | |
| 2020/0203181 A1* | 6/2020 | Le | C23F 1/18 |
| 2021/0305053 A1* | 9/2021 | Higuchi | C25F 3/14 |

OTHER PUBLICATIONS

Written Opinion issued in International Application No. PCT/CN2021/097253 dated Aug. 16, 2021 (3 pages).
Office Action issued in Chinese Application No. 202010519561.8, mailed on Mar. 29, 2025 (19 pages).

* cited by examiner

FIG    1

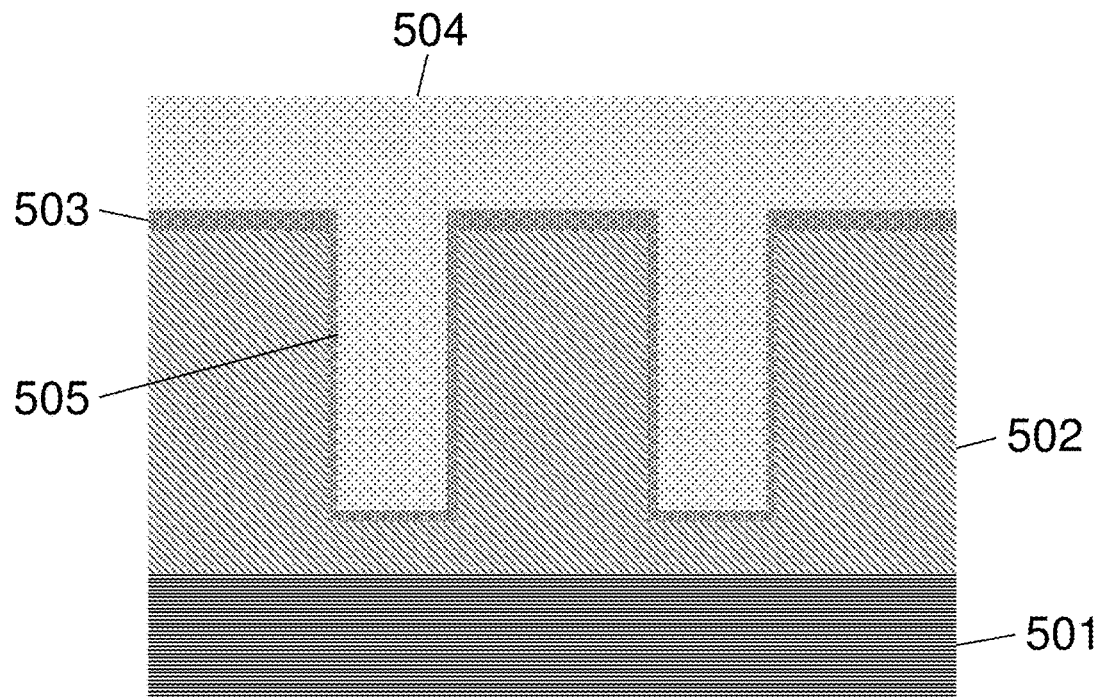
FIG    5a
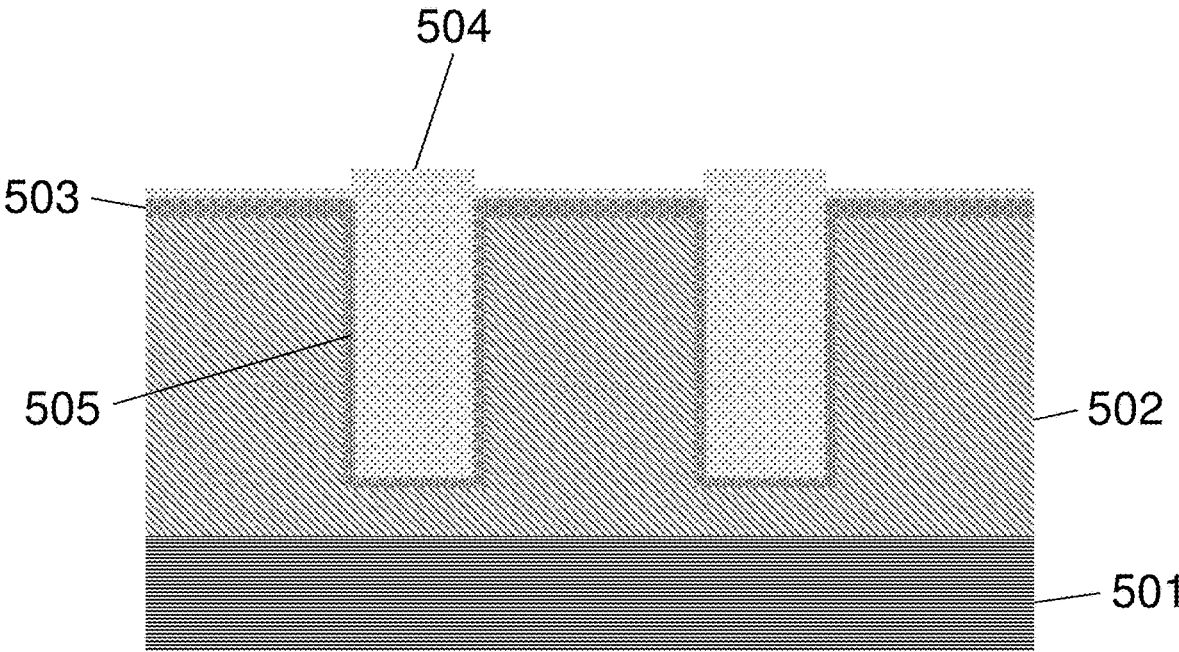
FIG    5b

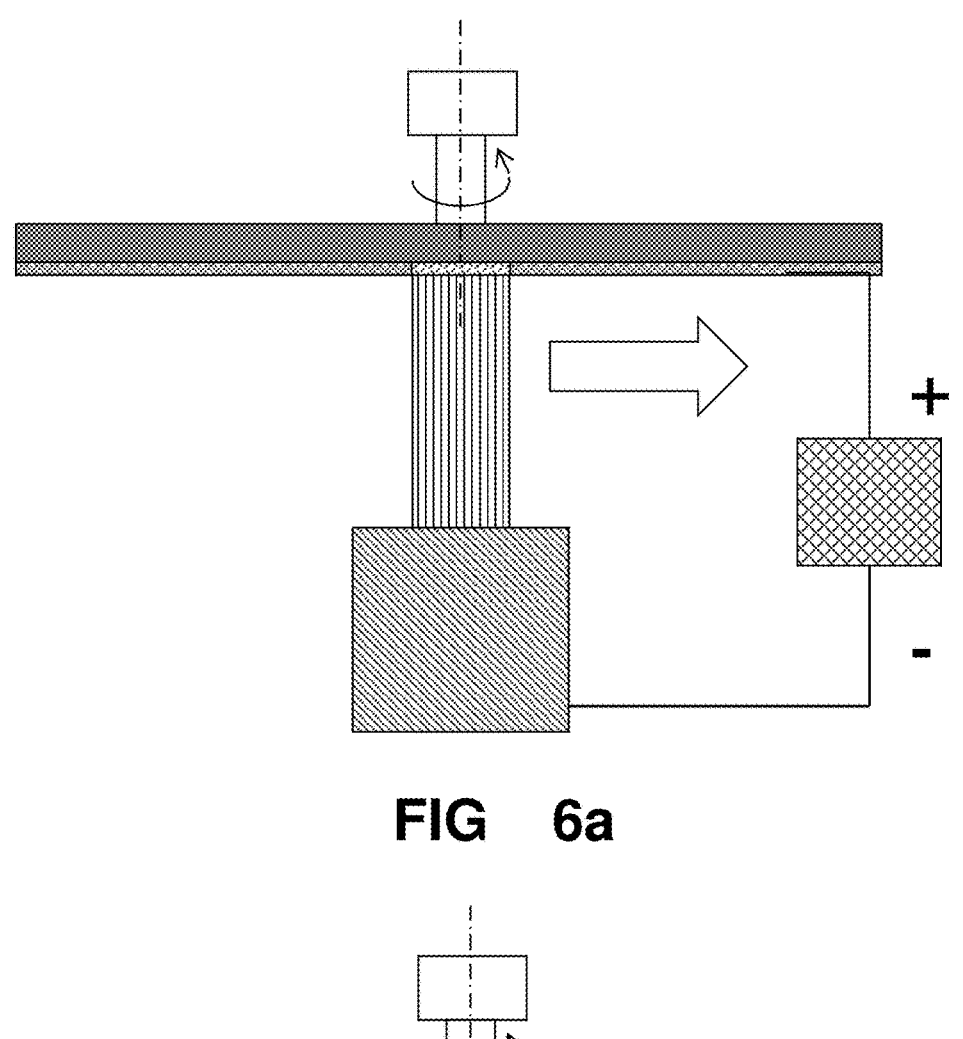
FIG    6a
FIG    6b

METHOD OF REMOVING BARRIER LAYER

BACKGROUND OF THE INVENTION

1. Field of the Invention

This invention relates to the field of semiconductor technology, and more particularly to the field of semiconductor fabrication processes.

2. The Related Art

As the feature size of Integrated Circuits (ICs) has been gradually reduced to below 14 nm, the emphasis of current development has been mainly focused on manufacturing technologies with process nodes of 10 nm and below. In the process nodes of 10 nm and below, the traditional Ta/TaN double-layer barrier structure will encounter problems such as the sharp increase of interconnect resistance and uneven deposition of copper seed layer when copper interconnects in the back end of line (BEOL) interconnection process.

In order to overcome these problems, Ruthenium (Ru) has been selected as the barrier layer of copper interconnection process in the next generation IC manufacturing due to its excellent electrochemical properties. Compared with Ta and TaN, Ru has lower resistivity and good adhesion to copper. In addition, copper can be uniformly deposited on the metallic ruthenium layer relatively easily.

The barrier layer is located between the metal layer and the dielectric layer. During the entire manufacturing process, part of the barrier layer needs to be removed and the other part of the barrier layer will be retained. Since the barrier layer is usually covered by a metal layer, when removing the barrier layer, the metal layer needs to be removed first and then the barrier layer needs to be removed. Grinding process and etching process are the main means to remove material layers in semiconductor manufacturing.

Chemical Mechanical Polishing (CMP) is the most common grinding process, and CMP is widely used to remove excess material layers to create a flat surface for the next metallization layer. CMP mainly removes materials by means of mechanical pressure, so there is no special requirement for the chemical properties of the material, and CMP can be applied to the removal of metal layer or barrier layer, including the grinding and removal of various metals such as Cu, Ta, TaN and Ru. In the case of metallic Ru, ruthenium oxide is generated by oxidation of an oxidizing agent such as $H_2O_2$ in the grinding slurry, and then the ruthenium oxide is removed by grinding. Because the CMP process is based on mechanical pressure, in the CMP process, the wafer is pressed on the grinding pad by downward pressure to grind. The wafer bears a great pressure during grinding, so it is easy to cause defects such as scratches, metal corrosion and abrasion, or even result in stress fragments. When entering the process node below 10 nm, as the density of IC structure on the wafer is greatly increased, the ability of the wafer to bear the mechanical stress also decreases, and the mechanical pressure of CMP is easy to cause greater damage to the wafer and IC structure. In addition, the CMP grinding process needs to consume a large amount of consumables such as grinding slurry and grinding pad, making the process more costly.

To solve the problem of mechanical stress, stress-free polishing (SFP) technology has been developed. SFP is an electrolytic polishing process in which the metal is oxidized into metal ions into the polishing fluid through an electrochemical reaction, thereby achieving the purpose of removing metals on the surface of the wafer. SFP is more used in the polishing of metal copper, more used to remove metal layer. SFP process mainly relies on electrochemical reaction to remove the metal layer. The advantage of SFP is that there is no external force loading on the wafer during the process, which avoids common defects of CMP such as scratches, metal corrosion and abrasion. In addition, the polishing fluid used in the SFP can be recycled, which greatly saves the process cost.

SFP is less used for directly removing a barrier layer because the materials used as the barrier layer, such as Ta, TaN, and Ru, generally have relatively stable chemical properties and react weakly with most chemical agents, and only have high reaction rates with certain chemical agents. In addition to CMP, chemical etching is often used to remove the barrier layer. HF is the most commonly used etchant to remove the barrier layer, which has a good etching rate for both Ta and TaN.

However, the situation changes when the material of the barrier layer becomes metallic Ru, because the chemical property of metallic Ru is very stable and the reaction rate with commonly used SFP electrolyte (phosphoric acid) and HF is very low. The experimental data shows that:

The removal amount of metal Ru is 3.2 angstroms (Å) in a 60 s period under the condition that phosphoric acid with the mass fraction of 30%-70% is used as electrolyte and the applied current is 5 A.

The removal amount of metal Ru is 2.6 angstroms (Å) in a 60 s period under the condition that HF with the mass fraction of 0.01% to 0.4% is used as etchant.

Both SFP electrolyte and HF have too low etching rates for metal Ru to meet the process requirements. If the etchant suitable for Ru is re developed, the period from research and development to mass production is too long to meet the demand in the short term, so it is more practical to improve the removal efficiency of Ru from the process point of view.

SUMMARY

The invention provides a method for the removal of metallic ruthenium barrier layers.

According to an embodiment of the invention, a method for removing a barrier layer of a metal interconnection on a wafer is provided, which is used for a process node of 10 nm and below and used for removing a single-layer metallic ruthenium barrier layer deposited between a dielectric layer and a copper layer, and the method comprises the following steps:

oxidizing step, is to oxidize the single-layer metal ruthenium barrier layer into a ruthenium oxide layer. The oxidizing step uses an electrochemical anodic oxidation process to oxidize the metal ruthenium barrier layer.

oxide layer etching step, is to etch the ruthenium oxide layer with etching liquid to remove the ruthenium oxide layer.

According to an embodiment, the electrochemical anodic oxidation process is carried out from the center to the edge of the wafer, or from the edge to the center of the wafer through a cathode nozzle. The electrolyte used in the electrochemical anodic oxidation process is phosphoric acid with a mass fraction of 30% to 70%, and the applied current is 0 A to 5 A.

According to an embodiment, the etching liquid used in the oxide layer etching step is HF with a mass fraction of 0.01 wt %-1 wt %, and the etching rate ratio of the etching liquid to the ruthenium oxide layer and the dielectric layer is greater than 0.62:1.

According to an embodiment of the invention, a method for removing a barrier layer of a metal interconnection on a wafer is provided, which is used in a structure of a process node of 10 nm and below. The structure comprises a substrate, a dielectric layer, a barrier layer and a metal layer. The dielectric layer is deposited on the substrate and recessed areas are formed on the dielectric layer. The barrier layer is deposited on the dielectric layer. The metal layer is deposited on the barrier layer, wherein the metal layer is a copper layer and the barrier layer is a single-layer metal ruthenium layer. The method comprises the following steps:

thinning step, is to thin the metal layer and remove most of the metal layer and leave a continuous metal layer on the surface of the barrier layer.

removing step, is to remove the metal layer on the non-recessed areas to expose the barrier layer, leaving the metal layer on the recessed areas with reserved thickness.

oxidizing step, is to oxidize the single-layer metal ruthenium barrier layer on the non-recessed areas into a ruthenium oxide layer, and meantime remove the retained metal layer on the recessed areas. The oxidizing step uses an electrochemical anodic oxidation process.

oxide layer etching step, is to etch the ruthenium oxide layer on the non-recessed areas with etching liquid to remove the ruthenium oxide layer, so that the recessed areas and the non-recessed areas have a flat surface after etching.

According to an embodiment, in the thinning step, the thickness of the continuous metal layer left on the surface of the barrier layer is 500-1000 angstroms (Å), wherein the thickness of the metal layer on the recessed areas is greater than that on the non-recessed areas.

According to an embodiment, the electrochemical anodic oxidation process is carried out from the center to the edge of the wafer, or from the edge to the center of the wafer through a cathode nozzle. The electrolyte used in the electrochemical anodic oxidation process is phosphoric acid with a mass fraction of 30% to 70%, and the applied current is 0 A to 5 A.

According to an embodiment, the electrolyte used in the electrochemical anodic oxidation process removes the copper layer while oxidizing the metal ruthenium barrier layer, wherein:

(oxidation rate of metal ruthenium/removal rate of copper)=(thickness of metal ruthenium barrier layer/thickness of copper layer reserved on recessed areas).

According to an embodiment, the etching liquid used in the oxide layer etching step is HF with a mass fraction of 0.01 wt %-1 wt %, and the etching rate ratio of the etching liquid to the ruthenium oxide layer and the dielectric layer is greater than 0.62:1.

According to an embodiment of the invention, a method for removing a barrier layer of a metal interconnection on a wafer is provided, which is used in a structure of a process node of 10 nm and below. The structure comprises a substrate, a dielectric layer, a barrier layer and a metal layer. The dielectric layer is deposited on the substrate and recessed areas are formed on the dielectric layer. The barrier layer is deposited on the dielectric layer. The metal layer is deposited on the barrier layer, wherein the metal layer is a copper layer, and the barrier layer is a single-layer metal ruthenium layer. The method comprises the following steps:

thinning the metal layer to a thickness below 2000 angstroms (Å) by CMP and keeping the metal layer continuous;

removing the metal layer on the non-recessed areas and oxidizing the single-layer metal ruthenium barrier layer on the non-recessed areas into a ruthenium oxide layer by electrochemical anodic oxidation process;

etching the ruthenium oxide layer on the non-recessed areas by using etching liquid to remove the ruthenium oxide layer, so that the recessed areas and the non-recessed areas have a flat surface after etching.

According to an embodiment of the invention, a method for removing a barrier layer of a metal interconnection on a wafer is provided, which is used in a structure of a process node of 10 nm and below. The structure comprises a substrate, a dielectric layer, a barrier layer and a metal layer. The dielectric layer is deposited on the substrate and recessed areas are formed on the dielectric layer. The barrier layer is deposited on the dielectric layer. The metal layer is deposited on the barrier layer, wherein the metal layer is a copper layer, and the barrier layer is a single-layer metal ruthenium layer. The method comprises the following steps:

removing the entire metal layer on the non-recessed areas by CMP until the barrier layer is exposed;

oxidizing the single-layer metal ruthenium barrier layer on the non-recessed areas into a ruthenium oxide layer by electrochemical anodic oxidation process;

etching the ruthenium oxide layer on the non-recessed areas by using etching liquid to remove the ruthenium oxide layer, so that the recessed areas and the non-recessed areas have a flat surface after etching.

The method of removing the barrier layer adopts the way of first oxidation and then etching, which effectively solves the problem of low removal efficiency of metal ruthenium. The reaction speed of ruthenium oxide and HF can meet the process requirements. Moreover, the removal selection ratio of the barrier layer and the dielectric layer can be adjusted by adjusting the concentration of HF. The invention uses electrochemical anodic oxidation, such as SFP process, to realize the oxidation of metal ruthenium, so that the whole process has higher efficiency and lower cost.

BRIEF DESCRIPTION OF THE DRAWINGS

FIG. 5a, FIG. 5b, FIG. 5c, and FIG. 5d illustrate the implementation process of the embodiment shown in FIG. 4.

FIG. 6a illustrates a schematic view of electrochemical anodic oxidation from the center to the edge of a wafer by a cathode nozzle.

FIG. 6b illustrates a schematic view of electrochemical anodic oxidation from the edge to the center of a wafer by a cathode nozzle.

DETAILED DESCRIPTION OF EMBODIMENTS

Figure 1:
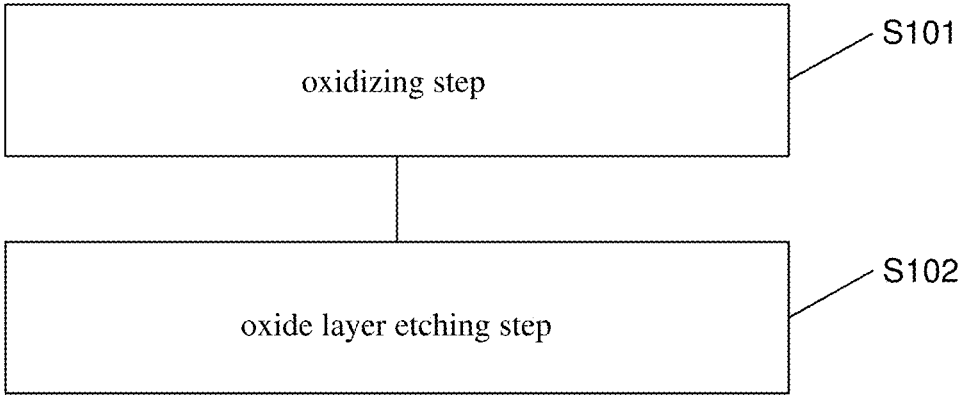
FIG. 1 illustrates a flowchart of a method for removing a barrier layer of a metal interconnection on a wafer according to an embodiment of the present invention.

Referring to FIG. 1 firstly, FIG. 1 illustrates a flowchart of a method for removing a barrier layer of a metal interconnection on a wafer according to an embodiment of the present invention. The method shown in FIG. 1 for removing a barrier layer of a metal interconnection on a wafer can be considered as a verification method in laboratory to verify the removal performance of metal ruthenium layers. The method for removing the barrier layer is used for a process node of 10 nm and below and used for removing a single-layer metal ruthenium barrier layer deposited between a dielectric layer and a copper layer. The method comprises the following steps:

S101: oxidizing step. The oxidizing step is to oxidize a single layer of metal ruthenium barrier layer into a ruthenium oxide layer. The oxidizing step uses an electrochemical anodic oxidation process to oxidize the metal ruthenium barrier layer. According to an embodiment, the electrochemical anodic oxidation process is carried out from the center to the edge of the wafer, or from the edge to the center of the wafer through a cathode nozzle. FIG. 6a and FIG. 6b illustrate schematic views of the process for electrochemical anodic oxidation, wherein FIG. 6a illustrates a schematic view of electrochemical anodic oxidation from the center to the edge of a wafer by a cathode nozzle and FIG. 6b illustrates a schematic view of electrochemical anodic oxidation from the edge to the center of a wafer by a cathode nozzle. There is no difference in the effect of using different process directions, and the specific process direction can be chosen according to the matching process and other practical needs. According to an embodiment, in the oxidizing step, the electrochemical anodic oxidation process is SFP. The electrolyte used in the electrochemical anodic oxidation process (SFP) is phosphoric acid with a mass fraction of 30% to 70%, and the applied current is 0 A to 5 A.

S102: oxide layer etching step. The oxide layer etching step is to etch the ruthenium oxide layer with etching liquid to remove the ruthenium oxide layer. According to an embodiment, the etching liquid used in the oxide layer etching step is HF with the mass fraction of 0.01 wt %-1 wt %, and the etching rate ratio of the etching liquid to the ruthenium oxide layer and the dielectric layer is greater than 0.62:1.

In one specific embodiment of the method of removing the barrier layer, the oxidizing step is carried out by using an SFP electrochemical process, and the electrolyte is phosphoric acid with a mass fraction of 30 wt % to 70 wt %, and the applied current is 5 A, and the duration is 60 s. The etching liquid used in the oxide layer etching step of this embodiment is HF with a mass fraction of 0.3 wt %, and the etching time is 60 s. The initial thickness of the metal ruthenium layer on the surface of the wafer is 2000 angstroms (Å). The etching rate of HF on ruthenium oxide is high after the metal ruthenium is oxidized to ruthenium oxide through the SFP electrochemical process. After the oxidation step with 60 s and the etching step with 60 s, the removal amount is 1393.7 Å. This removal efficiency can meet the requirement of removal rate in the actual process.

Figure 2:
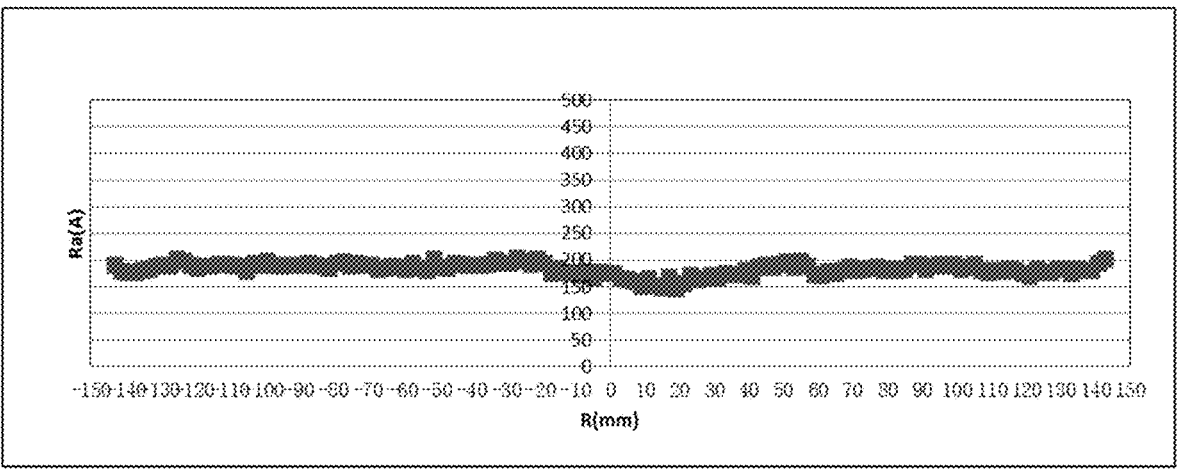
FIG. 2 illustrates the removal effect of metal ruthenium in the embodiment shown in FIG. 1.
Figure 3A:
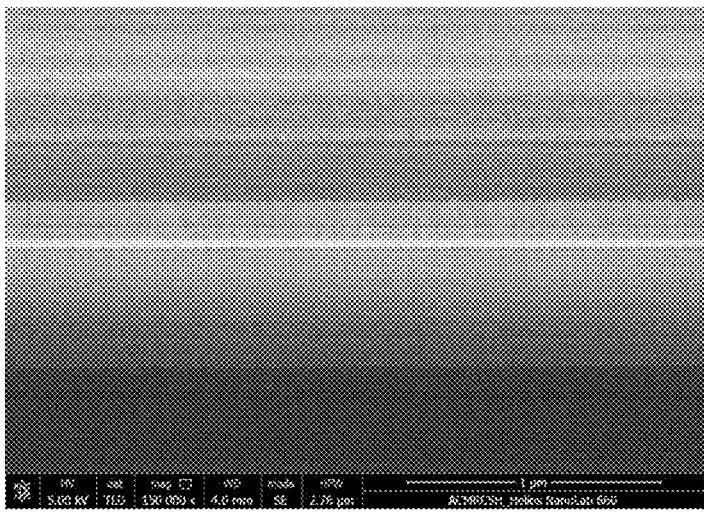
FIG. 3a and FIG. 3b illustrate comparison diagram before and after the implementation of the embodiment shown in FIG. 1.
Figure 3B:
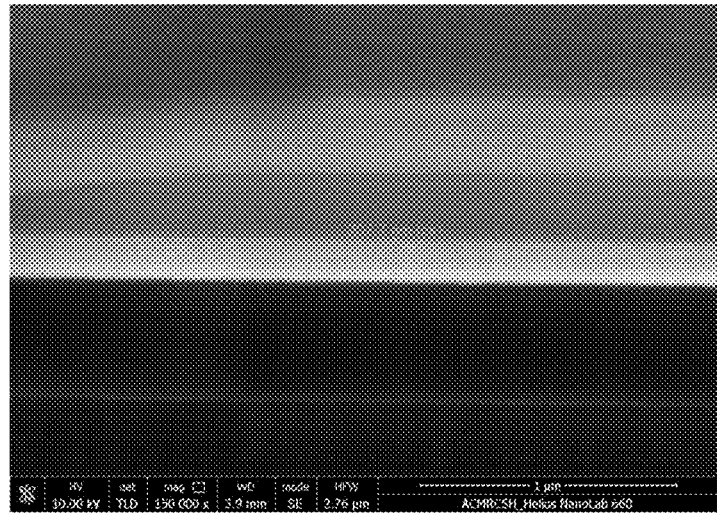

With reference to FIG. 2, FIG. 3a and FIG. 3b, another specific embodiment of the method of removing the barrier layer is disclosed, in which the SFP oxidation parameters are optimized by controlling the current or voltage and the motion rate to obtain different removal thicknesses and different removal rate morphologies. In an embodiment, the applied current is 0 A to 5 A, and the applied current is a given different value with the different position of the wafer movement. The wafer moves at a given movement speed in different positions, and the movement speed of the wafer in this embodiment ranges from 2.01 mm/s to 4.0 mm/s. The wafer covered with metal ruthenium layer is processed by this method, and then etched with 0.1 wt % HF solution for 20 s and then post-cleaned. The removal amount of Ru layer is measured, and the result is shown in FIG. 2. Referring to FIG. 2, the overall profile of Ru layer removal amount is relatively flat, and the average removal amount under this condition is 183.4 Å, and the uniformity (NU) is 5.99%, meeting the process requirement. In FIG. 2, the abscissa R represents the position from the center of the wafer and unit is mm, and the ordinate Ra represents the measured removal thickness and unit is angstroms. Sliced SEM analysis of the designated position of the wafer, for example, sliced SEM analysis of the 90 mm radius of the wafer shows that a flat and smooth surface of the ruthenium layer and the removal amount is calculated to be 183 angstroms (Å). FIG. 3a and FIG. 3b respectively disclose sliced SEM photographs before and after the oxidation and etching processes. It should be noted that the photographs shown in FIG. 3a and FIG. 3b are not from the same wafer due to the slicing process requirements. However, the wafer structure has high consistency, and even if wafers are different, it still has high reference significance as the basis of comparison. Referring to FIG. 3a, the position of the Ru layer reference surface is at 226 nm before the process is implemented. Referring to FIG. 3b, the position of the Ru layer reference surface is at 207.7 nm and the removal amount of Ru layer is 183 Å after the process is implemented.

In addition, under the condition that the ruthenium oxide layer oxidized by the SFP electrochemical process can be completely removed by HF, the relationship between the average removal amount of Ru layer and the process time of SFP is as follows:

$$Ra(Ru) = 3.1732t - 28.6 (Å)$$

Where, the Ra (Ru) means the removal amount of Ru layer, the t means the process time of SFP.

The removal amount of Ru layer refers to the metal Ru layer removed by HF etching after the metal Ru layer is oxidized by SFP. The thickness of the Ru layer is calculated based on the original Ru layer (without SFP process). The thickness of the Ru layer before and after the process is taken into account, rather than the thickness of the ruthenium oxide layer during the process in this formula.

According to an embodiment, the removal selection ratio of Ruthenium oxide layer and $SiO_2$ dielectric layer is adjusted by adjusting the concentration of HF, namely adjusting the mass fraction (wt %) of HF. Under the condition of the same SFP oxidation method, the same HF etching time, and the concentration of HF is selected to be 1 wt % and 0.1 wt % respectively, the metal Ru and the $SiO_2$ dielectric layer are respectively subjected to SFP oxidation and HF etching, and the etching amount and the etching selection ratio are calculated respectively.

Calculated results are as follows, the etching selection ratio of the ruthenium oxide layer (referred to RuO) and $SiO_2$ is R (RuO)/R $(SiO_2)$=0.62:1 while the concentration of HF is 1 wt %. The etching selection ratio of the ruthenium oxide layer and $SiO_2$ is R (RuO)/R $(SiO_2)$=18.42:1 while the concentration of HF is 0.1 wt %.

The etching selection ratio of the ruthenium oxide layer and $SiO_2$ can be improved by decreasing the concentration of HF appropriately, under the condition that the oxidized Ru by SFP is completely etched. The experimental test shows that the etching selection ratio of the ruthenium oxide layer and $SiO_2$ can reach more than 5:1 when the concentration of HF is less than or equal to 0.4 wt %. Therefore, in an embodiment, the concentration range of HF can be selected from 0.01 wt % to 1 wt % so that the etching rate ratio of the ruthenium oxide layer and the dielectric layer is greater than 0.62:1. In another embodiment, the concentration range of HF can be selected from 0.01 wt % to 0.4 wt % so that the etching rate ratio of the ruthenium oxide layer and the dielectric layer is greater than 5:1.

Besides, according to experiment, when the etching time is fixed, the etching amount of HF on $SiO_2$ conforms to the following formula:

$$Ra(SiO_2)=16171*C(HF)+17.343(\text{Å})$$

Where, the C means the concentration (mass fraction) of HF.

Figure 4:
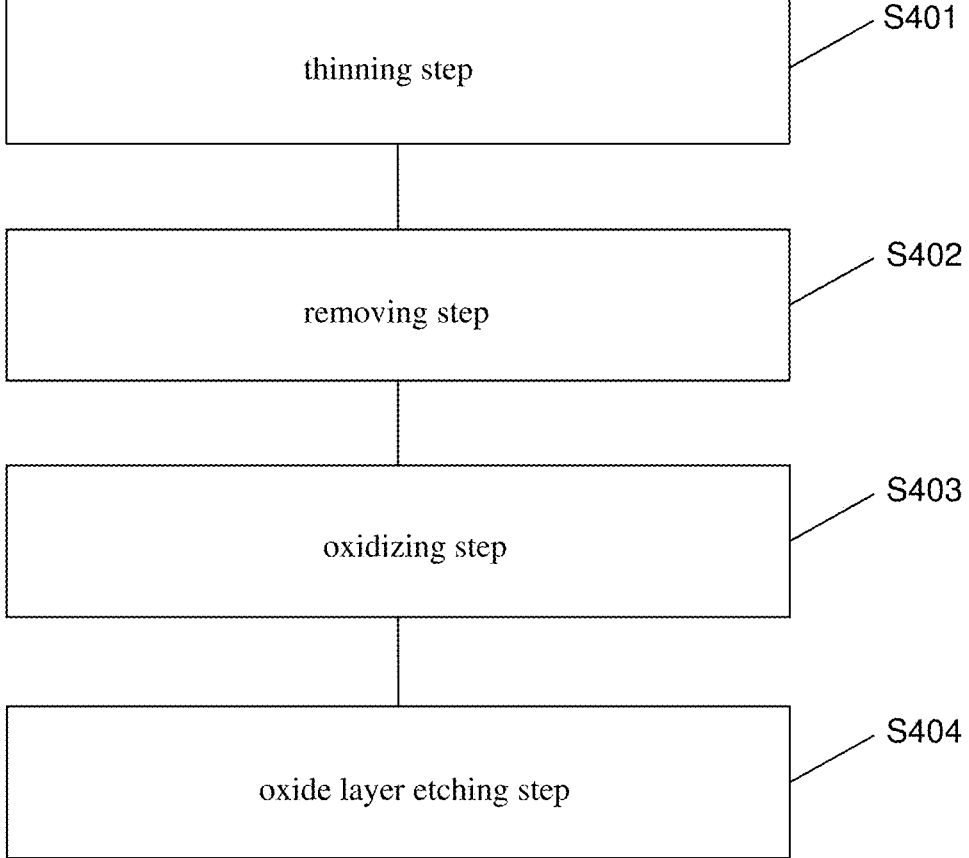
FIG. 4 illustrates a flowchart of a method for removing a barrier layer of a metal interconnection on a wafer according to another embodiment of the present invention.
Figure 5C:
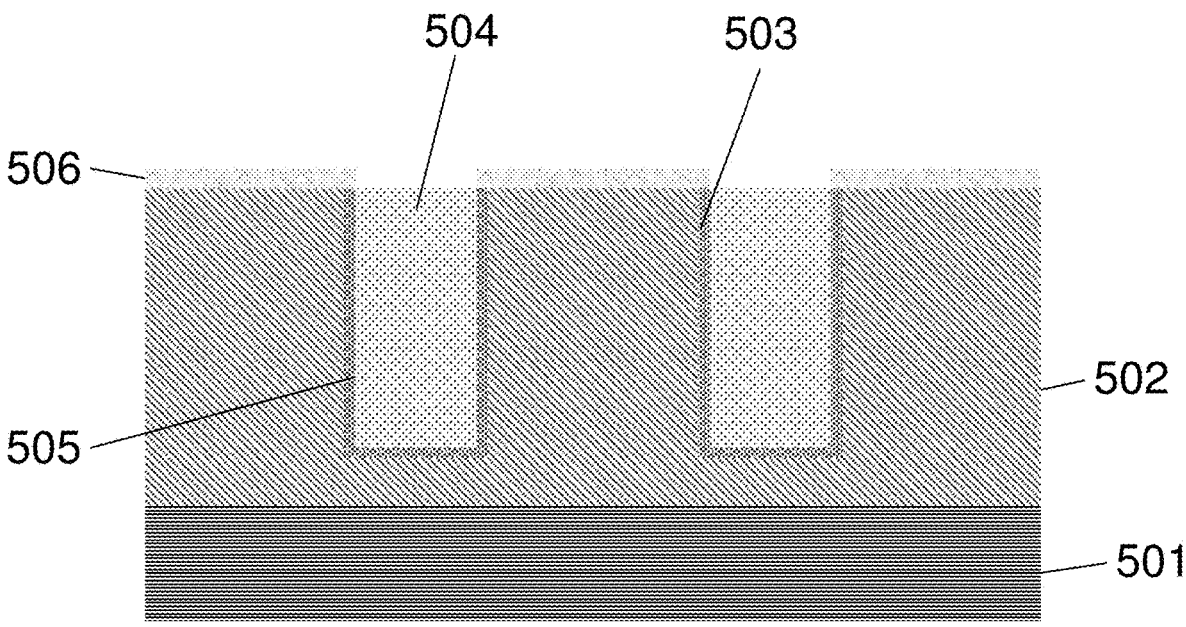

Referring to FIG. 4, FIG. 4 illustrates a flowchart of a method for removing a barrier layer of a metal interconnection on a wafer according to another embodiment of the present invention. The method shown in FIG. 4 for removing a barrier layer of a metal interconnection on a wafer can be considered as a field implementation process that can be used for mass production. FIG. 5a, FIG. 5b, FIG. 5c, and FIG. 5d illustrate the implementation process of the embodiment shown in FIG. 4. The method for removing a barrier layer of a metal interconnection on a wafer is used in a structure of a process node of 10 nm and below. FIG. 5a shows the structure. The structure comprises a substrate 501, a dielectric layer 502, a barrier layer 503 and a metal layer 504. The dielectric layer 502 is deposited on the substrate 501. Recessed areas 505 are formed on the dielectric layer 502 and the recessed areas 505 are holes or grooves. The barrier layer 503 is deposited on the dielectric layer 502, and the metal layer 504 is deposited on the barrier layer 503, wherein the metal layer 504 is a copper layer and the barrier layer 502 is a single-layer metal ruthenium layer. The method of removing the barrier layer 503 comprises the following steps:

S401: thinning step. The metal layer is thinned to remove most of the metal layer and leave a continuous metal layer 504 on the surface of the barrier layer 503. In an embodiment, the thickness of the continuous metal layer 504 left on the surface of the barrier layer 503 is 500-1000 angstroms in the thinning step, wherein the thickness of the metal layer on the recessed areas is greater than the thickness of the metal layer on the non-recessed areas. The thinning step can adopt a CMP process and also can adopt an SPF process. The structure after the thinning step is shown in FIG. 5b, where the thicker metal layer is remained on the recessed areas, and the thinner metal layer is remained on the non-recessed areas.

S402: removing step. The metal layer on the non-recessed areas is removed to expose the barrier layer, and the metal layer on the recessed areas is retained with the reserved thickness. All the metal layers on the non-recessed areas are removed in the removing step, but leaves a certain thickness of metal layer on the recessed areas. The purpose of retaining the metal layer is to continue to use the SFP process in the next oxidizing step. The SFP process will etch the copper layer while oxidizing the metal ruthenium and in order to avoid excessive etching of the metal layer in the recessed areas during the oxidizing step, a certain thickness of the metal layer should be retained on the recessed areas. The removing step is usually performed using the SFP process.

S403: oxidizing step. The single layer metal ruthenium barrier layer on the non-recessed areas is oxidized to a ruthenium oxide layer, and meantime the retained metal layer on the recessed areas is removed. The metal ruthenium barrier layer is oxidized to a ruthenium oxide layer though an electrochemical anodic oxidation process in the oxidation step. In an embodiment, the electrochemical anodic oxidation process is carried out from the center to the edge of the wafer, or from the edge to the center of the wafer through a cathode nozzle. FIG. 6a and FIG. 6b illustrate schematic views of the process of electrochemical anodic oxidation, wherein FIG. 6a illustrates a schematic view of electrochemical anodic oxidation from the center to the edge of a wafer by a cathode nozzle, and FIG. 6b illustrates a schematic view of electrochemical anodic oxidation from the edge to the center of a wafer by a cathode nozzle. There is no difference in the effect of using different process directions, and the specific process direction can be chosen according to the matching process and other practical needs. In an embodiment, the electrochemical anodic oxidation process is SFP in the oxidation step, and the electrolyte used in the electrochemical anodic oxidation process (SFP) is phosphoric acid with a mass fraction of 30% to 70%, and the applied current is 0 A to 5 A. The parameters of the SFP used in the oxidation step are different from the parameters of the SFP used in the removing step. The SFP used in the removing step is mainly concerned with the effective etching of the copper layer, while the parameters of the SFP used in the oxidation step needs to consider both the oxidation of the metal ruthenium and the etching of the metal copper. The electrolyte used in the SFP electrochemical process in the oxidation step removes the copper layer while oxidizing the metal ruthenium barrier layer, wherein:

(oxidation rate of metal ruthenium/removal rate of copper)=(thickness of metal ruthenium barrier layer/thickness of copper layer reserved on recessed areas).

According to an embodiment, the polishing amount of Cu layer is 1052.6 angstroms under the conditions that the electrolyte of SFP is phosphoric acid with a mass fraction of 30 wt % to 70 wt %, and the applied current is 5 A, and the duration is 60 s. The ratio of the oxidation amount of Ru to the polishing amount of Cu is about 0.17:1 under the same SFP electrochemical treatment condition. Correspondingly, the ratio of the reserved thickness of the copper layer on the recessed areas to the thickness of the Ru barrier layer is 1:0.17 in the step S402. After the oxidation step, the structure is shown in FIG. 5c, where the copper layer on the non-recessed areas is removed and the copper layer 504 remains in the recessed areas 505. The metal ruthenium layer on the non-recessed areas is oxidized to a ruthenium oxide layer 506. The metal ruthenium layer 503 is still remained on the sidewall of the recessed areas 505.

Figure 5D:
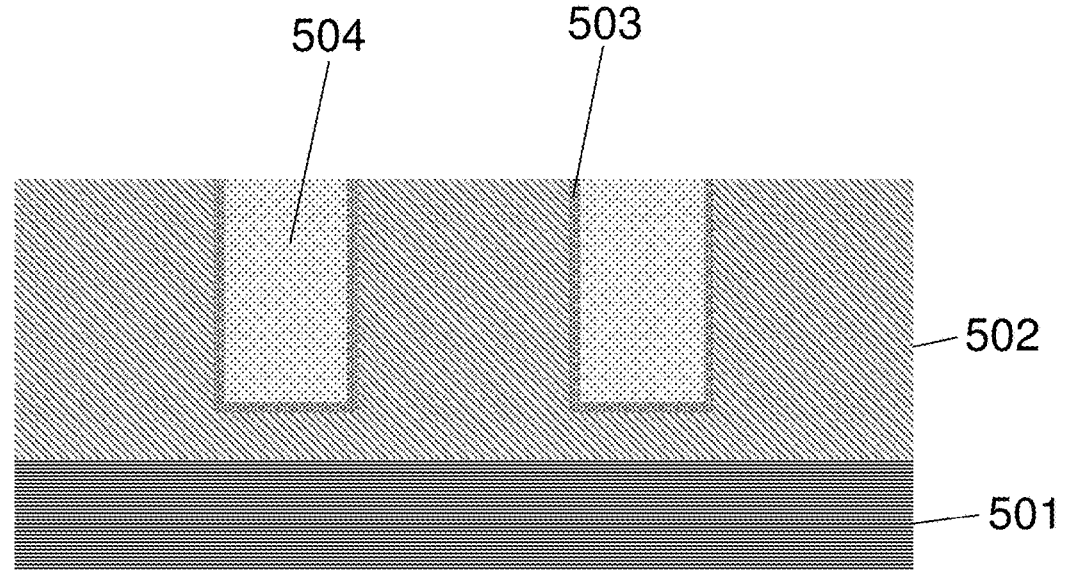

S404: oxide layer etching step. The ruthenium oxide layer on the non-recessed areas is etched with etching liquid to remove the ruthenium oxide layer, so that the recessed areas and the non-recessed areas have a flat surface after etching. In an embodiment, the etching liquid used in the oxide layer etching step is HF with a mass fraction of 0.01 wt %-1 wt %, and the etching rate ratio of the etching liquid to the ruthenium oxide layer and the dielectric layer is greater than 0.62:1. As previously described, the etching selection ratio for Ru oxide layer and $SiO_2$ can be improved by appropriate reducing the concentration of HF, thus according to another embodiment, the concentration range of HF can be selected from 0.01 wt % to 0.4 wt % so that the etching rate ratio of the ruthenium oxide layer and the dielectric layer is greater than 5:1. After the oxide layer etching step, the structure is shown in FIG. 5d, where the Ru oxide layer on the non-recessed areas is removed, the Cu layer 504 remains in the recessed areas 505, and the Ru layer 503 as a single-layer barrier is still remained on the sidewall of the recessed areas 505. The recessed areas and the non-recessed areas have a flat surface after etching.

Another embodiment of the present invention, which is also a specific implementation process of a method for removing a barrier layer of a metal interconnection on a wafer, is disclosed and the method is used in a structure of a process node of 10 nm and below. The structure comprises a substrate, a dielectric layer, a barrier layer and a metal layer. The dielectric layer is deposited on the substrate. Recessed areas are formed on the dielectric layer. The barrier layer is deposited on the dielectric layer, and the metal layer is deposited on the barrier layer, wherein the metal layer is a copper layer, and the barrier layer is a single-layer metal ruthenium layer. The method has the same basic idea as the previous methods, but differs in some process details, which comprises the following steps:

thinning the metal layer by CMP until the thickness of the metal layer is below 2000 angstroms and the metal layer is continuous. In this method, relatively more metal layer is retained when CMP is used to thin the metal layer, about 2000 angstroms.

removing the metal layer on the non-recessed areas and oxidizing the single-layer metal ruthenium barrier layer on the non-recessed areas to a ruthenium oxide layer by electrochemical anodic oxidation process. This method is equivalent to using the electrochemical anodic oxidation process to complete the removing step and the oxidizing step.

etching the ruthenium oxide layer on the non-recessed areas by etching liquid to remove the ruthenium oxide layer, so that the recessed areas and the non-recessed areas have a flat surface after etching. This step is the same as the oxide layer etching step in the previous method.

Another embodiment of the present invention, which is also a specific implementation process of a method for removing a barrier layer of a metal interconnection on a wafer, is disclosed and the method is used in a structure of a process node of 10 nm and below. The structure comprises a substrate, a dielectric layer, a barrier layer and a metal layer. The dielectric layer is deposited on the substrate. Recessed areas are formed on the dielectric layer. The barrier layer is deposited on the dielectric layer, and the metal layer is deposited on the barrier layer, wherein the metal layer is a copper layer, and the barrier layer is a single-layer metal ruthenium layer. The method has the same basic idea as the previous methods, but differs in some process details, which comprises the following steps:

removing the entire metal layer on the non-recessed areas by CMP until the barrier layer is exposed. In this method, CMP is directly used to remove the entire metal layer, which is equivalent to that the thinning step and the removing step are combined and completed by CMP.

oxidizing the single-layer ruthenium barrier layer on the non-recessed areas to ruthenium oxide layer by electrochemical anodic oxidation process. It is equivalent to that the oxidizing step is completed by the electrochemical anodic oxidation process.

etching the ruthenium oxide layer on the non-recessed areas by etching liquid to remove the ruthenium oxide layer, so that the recessed areas and the non-recessed areas have a flat surface after etching. This step is the same as the oxide layer etching step in the previous method.

The method of removing a barrier layer of the present invention adopts the way of first oxidation and then etching, which effectively solves the problem of low removal efficiency of metal ruthenium. The reaction speed of oxidized ruthenium oxide and HF can meet the process requirements. Moreover, the removal selection ratio of the barrier layer and the dielectric layer can be adjusted by adjusting the concentration of HF. The invention uses electrochemical anodic oxidation to realize the oxidation of metal ruthenium, such as SFP process, so that the whole process has higher efficiency and lower cost.

The above embodiments are provided to those skilled in the art to realize or use the invention, under the condition that various modifications or changes being made by those skilled in the art without departing the spirit and principle of the invention, the above embodiments may be modified and changed variously, therefore the protection scope of the invention is not limited by the above embodiments, rather, it should conform to the maximum scope of the innovative features mentioned in the claims.

What is claimed is:

1. A method for removing a barrier layer of a metal interconnection on a wafer, wherein the method is used for a process node of 10 nm and below and used for removing a single-layer metal ruthenium barrier layer deposited between a dielectric layer and a copper layer, and the method comprises the following steps:

oxidizing step, being to oxidize the single-layer metal ruthenium barrier layer into a ruthenium oxide layer, and the oxidizing step uses an electrochemical anodic oxidation process to oxidize the metal ruthenium barrier layer;

oxide layer etching step, being to etch the ruthenium oxide layer with etching liquid to remove the ruthenium oxide layer, and the etching liquid used in the oxide layer etching step is HF with a mass fraction of 0.01 wt %-1 wt %, and the etching rate ratio of the etching liquid to the ruthenium oxide layer and the dielectric layer is greater than 0.62:1.

2. The method for removing a barrier layer of a metal interconnection on a wafer according to claim 1, wherein the electrochemical anodic oxidation process is carried out from the center to the edge of the wafer, or from the edge to the center of the wafer through a cathode nozzle, and the electrolyte used in the electrochemical anodic oxidation process is phosphoric acid with a mass fraction of 30% to 70%, and the applied current is 0 A to 5 A.

3. A method for removing a barrier layer of a metal interconnection on a wafer, wherein the method is used in a structure of a process node of 10 nm and below, and the structure comprises a substrate, a dielectric layer, a barrier layer and a metal layer, the dielectric layer is deposited on the substrate and recessed areas are formed on the dielectric layer, the barrier layer is deposited on the dielectric layer, the metal layer is deposited on the barrier layer, wherein the metal layer is a copper layer, the barrier layer is a single-layer metal ruthenium layer, the method comprises the following steps:

thinning step, being to thin the metal layer, and removing most of the metal layer and leaving a continuous metal layer on the surface of the barrier layer;

removing step, being to remove the metal layer on the non-recessed areas to expose the barrier layer, leaving the metal layer on the recessed areas with reserved thickness;

oxidizing step, being to oxidize the single-layer metal ruthenium barrier layer on the non-recessed areas into a ruthenium oxide layer, and meantime remove the retained metal layer on the recessed areas, the oxidizing step using an electrochemical anodic oxidation process; and oxide layer etching step, being to etch the ruthenium oxide layer on the non-recessed areas with etching liquid to remove the ruthenium oxide layer, so that the recessed areas and the non-recessed areas have a flat surface after etching.

4. The method for removing a barrier layer of a metal interconnection on a wafer according to claim 3, wherein in the thinning step, the thickness of the continuous metal layer left on the surface of the barrier layer is 500-1000 angstroms, the thickness of the metal layer on the recessed areas is greater than the thickness of the metal layer on the non-recessed areas.

5. The method for removing a barrier layer of a metal interconnection on a wafer according to claim 3, wherein the electrochemical anodic oxidation process is carried out from the center to the edge of the wafer, or from the edge to the center of the wafer through a cathode nozzle, and the electrolyte used in the electrochemical anodic oxidation process is phosphoric acid with a mass fraction of 30% to 70%, and the applied current is 0 A to 5 A.

6. The method for removing a barrier layer of a metal interconnection on a wafer according to claim 5, wherein the electrolyte used in the electrochemical anodic oxidation process removes the copper layer while oxidizing the metal ruthenium barrier layer, wherein:

(oxidation rate of metal ruthenium/removal rate of copper)=(thickness of metal ruthenium barrier layer/thickness of copper layer reserved on recessed areas).

7. The method for removing a barrier layer of a metal interconnection on a wafer according to claim 4, wherein the etching liquid used in the oxide layer etching step is HF with a mass fraction of 0.01 wt %-1 wt %, and the etching rate ratio of the etching liquid to the ruthenium oxide layer and the dielectric layer is greater than 0.62:1.

8. A method for removing a barrier layer of a metal interconnection on a wafer, wherein the method is used in a structure of a process node of 10 nm and below, and the structure comprises a substrate, a dielectric layer, a barrier layer and a metal layer, the dielectric layer is deposited on the substrate and recessed areas are formed on the dielectric layer, the barrier layer is deposited on the dielectric layer, the metal layer is deposited on the barrier layer, wherein the metal layer is a copper layer, the barrier layer is a single-layer metal ruthenium layer, the method comprises the following steps:

thinning the metal layer to a thickness below 2000 angstroms (Å) by CMP and keeping the metal layer continuous;

removing the metal layer on the non-recessed areas and oxidizing the single-layer metal ruthenium barrier layer on the non-recessed areas into a ruthenium oxide layer by electrochemical anodic oxidation process; and etching the ruthenium oxide layer on the non-recessed areas by using etching liquid to remove the ruthenium oxide layer, so that the recessed areas and the non-recessed areas have a flat surface after etching.

9. A method for removing a barrier layer of a metal interconnection on a wafer, wherein the method is used in a structure of a process node of 10 nm and below, and the structure comprises a substrate, a dielectric layer, a barrier layer and a metal layer, the dielectric layer is deposited on the substrate and recessed areas are formed on the dielectric layer, the barrier layer is deposited on the dielectric layer, the metal layer is deposited on the barrier layer, wherein the metal layer is a copper layer, the barrier layer is a single-layer metal ruthenium layer, the method comprises the following steps:

removing the entire metal layer on the non-recessed areas by CMP until the barrier layer is exposed;

oxidizing the single-layer metal ruthenium barrier layer on the non-recessed areas into a ruthenium oxide layer by electrochemical anodic oxidation process; and etching the ruthenium oxide layer on the non-recessed areas by using etching liquid to remove the ruthenium oxide layer, so that the recessed areas and the non-recessed areas have a flat surface after etching.

\* \* \* \* \*